(12) United States Patent
Dakhil (10) Patent No.: US 9,884,772 B2
(45) Date of Patent: Feb. 6, 2018

(54) SOLAR DESALINATION AND POWER GENERATION PLANT

(71) Applicant: Farouk Dakhil, Rome (IT)

(72) Inventor: Farouk Dakhil, Rome (IT)

(*) Notice: Subject to any disclaimer, the term of this patent is extended or adjusted under 35 U.S.C. 154(b) by 857 days.

(21) Appl. No.: 14/255,404

(22) Filed: Apr. 17, 2014

(65) Prior Publication Data
US 2015/0299013 A1  Oct. 22, 2015

(51) Int. Cl.
| | | |
|---|---|---|
| *E03B 3/02* | (2006.01) | |
| *C02F 1/04* | (2006.01) | |
| *B01D 1/00* | (2006.01) | |
| *C02F 1/14* | (2006.01) | |
| *C02F 3/32* | (2006.01) | |
| *C02F 103/08* | (2006.01) | |
| *H02S 40/44* | (2014.01) | |
| *H01L 31/0525* | (2014.01) | |
| *C02F 1/00* | (2006.01) | |

(52) U.S. Cl.
CPC .............. *C02F 1/14* (2013.01); *B01D 1/0029* (2013.01); *B01D 1/0035* (2013.01); *C02F 1/004* (2013.01); *C02F 1/04* (2013.01); *C02F 1/048* (2013.01); *C02F 3/327* (2013.01); *C02F 2103/08* (2013.01); *E03B 3/02* (2013.01); *H01L 31/0525* (2013.01); *H02S 40/44* (2014.12)

(58) Field of Classification Search
CPC .. C02F 1/04; C02F 1/041; C02F 1/042; C02F 1/043; C02F 1/045; C02F 1/046; C02F 1/047; C02F 1/048; C02F 1/06; C02F 1/08; C02F 1/10; C02F 1/12; C02F 1/14; C02F 1/16; C02F 1/18; F24J 2/07; F24J 2002/075; H01L 31/0525; H02S 40/44; E03B 3/02; B01D 1/0029; B01D 1/0035
See application file for complete search history.

(56) References Cited

U.S. PATENT DOCUMENTS

| | | | | |
|---|---|---|---|---|
| 3,775,257 A | * | 11/1973 | Lovrich | .................... C02F 1/14 159/903 |
| 4,338,922 A | * | 7/1982 | Moore | .................... B01J 19/127 126/569 |
| 4,498,959 A | * | 2/1985 | Sakamoto | ............. B01D 5/0066 202/185.2 |
| 7,296,410 B2 | * | 11/2007 | Litwin | ..................... F03G 6/065 60/641.12 |
| 8,033,110 B2 | * | 10/2011 | Gilon | ...................... F03G 6/001 60/641.11 |
| 8,246,786 B2 | * | 8/2012 | Cap | ...................... B01D 1/0035 159/903 |
| 8,365,529 B2 | * | 2/2013 | Litwin | ..................... F03G 6/06 60/641.11 |
| 9,162,912 B2 | * | 10/2015 | Marin | ..................... C02F 1/004 |

(Continued)

*Primary Examiner* — Jonathan Miller
*Assistant Examiner* — Jonathan Luke Pilcher
(74) *Attorney, Agent, or Firm* — Maier & Maier, PLLC (57) ABSTRACT

A system for collecting solar energy and generating fresh water. The system may include a solar energy collection sub-system, a salt water distillation sub-system, and a cooling sub-system. The solar energy collection sub-system may further include one or more solar energy collection assemblies, which may heat a thermally-conductive fluid, which may be used to generate electricity. The salt water distillation sub-system may include a pump, piping, and a distillation cavity. A natural filtration and living flora/fauna sub-system may also be included.

17 Claims, 11 Drawing Sheets

(56) References Cited

U.S. PATENT DOCUMENTS

| | | | | |
|---|---|---|---|---|
| 9,202,396 B2* | 12/2015 | Mackler | .................. | G09F 11/025 |
| 2008/0000231 A1* | 1/2008 | Litwin | ...................... | F03G 6/06 |
| | | | | 60/641.11 |
| 2009/0229264 A1* | 9/2009 | Gilon | ...................... | F03G 6/001 |
| | | | | 60/641.8 |
| 2010/0000596 A1* | 1/2010 | Mackler | ................ | G09F 11/025 |
| | | | | 136/246 |
| 2011/0048006 A1* | 3/2011 | Cap | ...................... | B01D 1/0035 |
| | | | | 60/641.5 |
| 2011/0229775 A1* | 9/2011 | Michaels | ............... | C12M 21/02 |
| | | | | 429/401 |
| 2012/0055857 A1* | 3/2012 | Marin | ..................... | C02F 1/004 |
| | | | | 210/97 |
| 2013/0019598 A1* | 1/2013 | Tamaura | ................ | F01K 25/10 |
| | | | | 60/641.8 |
| 2013/0306463 A1* | 11/2013 | Halas | .................. | B01D 1/0023 |
| | | | | 203/50 |
| 2015/0214408 A1* | 7/2015 | Dakhil | ....................... | F24J 2/38 |
| | | | | 136/248 |
| 2016/0315583 A1* | 10/2016 | Dakhil | .................... | F03G 6/00 |
| 2016/0344077 A1* | 11/2016 | Dakhil | .................. | H01M 12/02 |

\* cited by examiner fig.1 fig. 1a fig. 1b fig.3 fig.4 fig.5 fig.6 fig.7

SOLAR DESALINATION AND POWER GENERATION PLANT

BACKGROUND

By the year 2025 it is estimated that two thirds of the world population will have limited if any access to fresh water. This scenario is further complicated due to population growth, industrialization, pollution of ground water and climate change.

In addition, the world's population has already exceeded seven billion people and it continues to grow exponentially higher. By the year 2050 we may reach 9.5 billion people. While the planet's population is increasing, we also continue the pollution of lands, rivers, and oceans through toxic emissions, mainly by burning fossil fuels to power heavy industry and vehicles. These are the facts of our daily news and contribute to global warming and climate change.

Perhaps more important to the planet's inhabitants than temperature will be how much rising greenhouse gases crank up the water cycle. It is predicted that precipitation will increase where it is already relatively high—tropical rain forests, for example—and decrease it where it is already low, as in the subtropics. The oceans cover 71% of the globe, hold 97% of its water, and receive 80% of its precipitation. Dry places getting drier would mean longer and more intense droughts, and a stronger need for fresh water in those locations. There is mounting scientific evidence which shows that only a small change in global warming can drastically affect the living conditions of billions of people globally, particularly due to the effect on potential water shortages and all that relies on water, from food to sanitation and public health.

Desalination plants are currently used to create fresh water from salt water, which is commonly sourced from the ocean. A common method used in the desalination process is to filter the water and then use reverse osmosis (RO) to remove the remaining dissolved solids and salts to produce fresh water. However, there are several concerns with desalination because of the potential negative environmental impacts. Electric energy, the main power source for RO desalination plants, results in the emission of air pollutants and greenhouse gases that further exacerbate climate change. Current state-of-the-art RO plants consume between 3 and 4 kWh/m3 of produced water and emit between 1.4 and 1.8 kg $CO_2$/m3 of produced water. However, this energy requirement does not include the energy needed for intake, discharge, pre-treatment, post-treatment and brine for which additional 1 kWh/m3 is needed.

Large RO plants may require an additional and separate power plant just to supply the huge amount of electrical power needed for its function. The additional power plant creates a lot of $CO_2$ emissions and other pollution, a real negative impact on the environment. Also, before the sea water is pumped through the RO filters at high pressure, it must first be pumped through special filters to eliminate algae and particulates, adding to the energy consumption and costs of the process. Additionally, RO plants cause a hazard to the sea/ocean environment, because the high-speed pumping into the filters can capture and kill many small living organisms, like passing fish.

A solution is needed which can increase self-sufficiency. In particular, the costs of producing clean water heavily tax the environment; there is a need for a low-cost method for meeting those needs on a mass scale.

SUMMARY

According to at least one exemplary embodiment, a system for collecting solar energy and generating fresh water may be disclosed. The system may include a solar energy collection sub-system, a salt water distillation sub-system, and a cooling sub-system. The solar energy collection sub-system may further include one or more solar energy collection assemblies, which may heat a thermally-conductive fluid, which may be used to generate electricity. The salt water distillation sub-system may include a pump, piping, and a distillation cavity. The distillation cavity may be heated in part by the heated thermally-conductive fluid and may be cooled in part by the cooling sub-system. A natural filtration and living flora/fauna sub-system may also be included.

BRIEF DESCRIPTION OF THE FIGURES

Advantages of embodiments of the present invention will be apparent from the following detailed description of the exemplary embodiments. The following detailed description should be considered in conjunction with the accompanying figures in which.

Exemplary

Exemplary

Exemplary

Exemplary

Exemplary

Exemplary

Exemplary

Exemplary

Exemplary

Exemplary

Exemplary

DETAILED DESCRIPTION

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiment are not necessarily to be construed as preferred or advantageous over other embodiments. Moreover, the terms "embodiments of the invention", "embodiments" or "invention" do not require that all embodiments of the invention include the discussed feature, advantage or mode of operation.

According to at least one exemplary embodiment, a system for collecting solar energy and generating fresh water may be disclosed. The system may include a solar energy collection sub-system, a salt water distillation sub-system, and a cooling sub-system. The solar energy collection sub-system may further include one or more solar energy collection assemblies, which may heat a thermally-conductive fluid, which may be used to generate electricity. The salt water distillation sub-system may include a pump, piping, and a distillation cavity. The distillation cavity may be heated in part by the heated thermally-conductive fluid and may be cooled in part by the cooling sub-system. A natural filtration and living flora/fauna sub-system may also be included.

Figure 1:
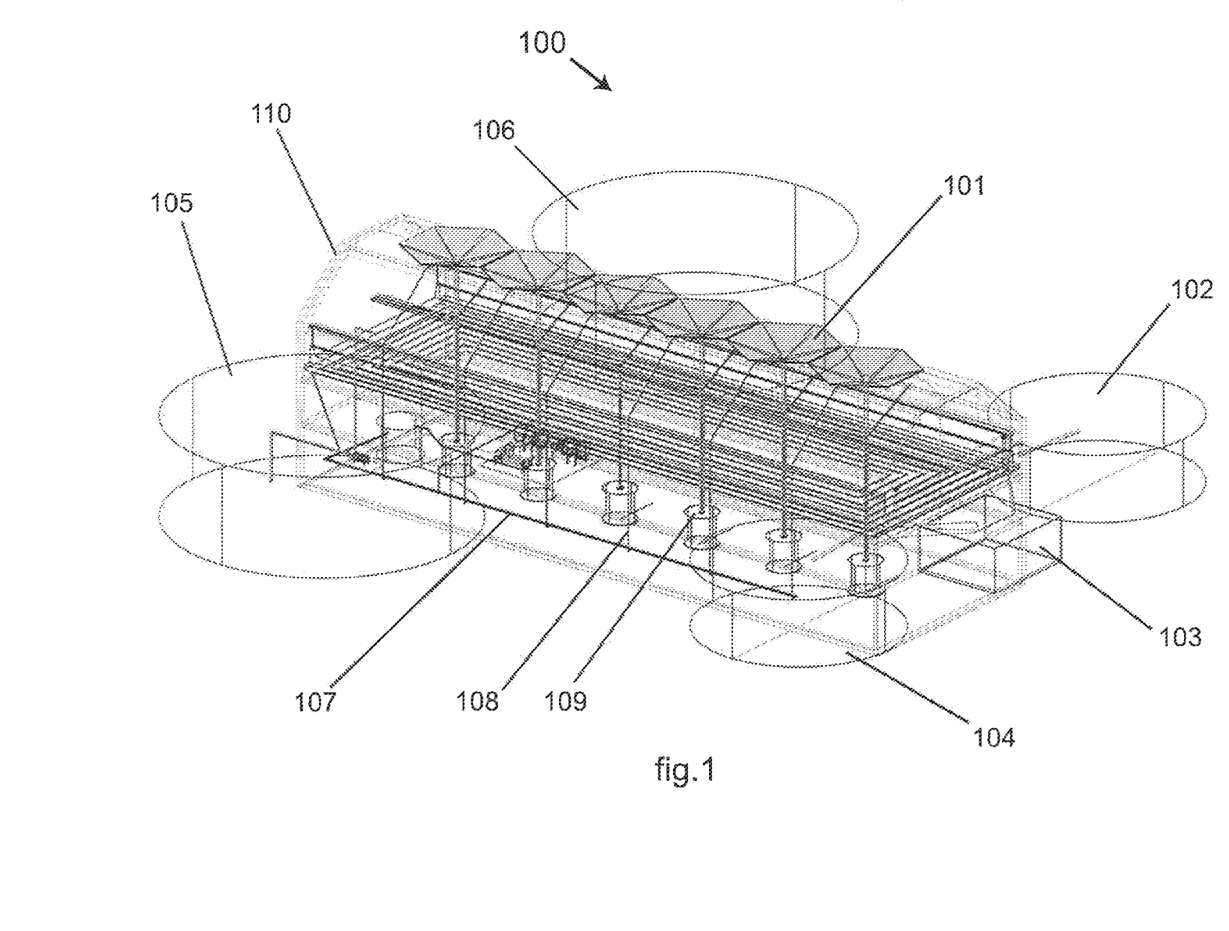
FIG. 1 shows an isometric wireframe view of an embodiment

Referring to exemplary FIG. 1, a solar desalination plant 100 may include one or more solar energy collection assemblies 101, a roof 110 with a slanted component, one or more fresh water collection tanks 102 and 104, and an open interior cavity which may be artificially heated. Each energy collection assembly 101 may include several solar energy collection units in a concave structure, as further described below and shown in exemplary FIGS. 1a and 1b. The open cavity may be defined in part by a floor bed (not shown here) beneath which a heating system may be located, for example a serpentine pipe system, as further described below. The floor bed may be constructed to hold or contain salt water to be purified or distilled. According to at least one embodiment, the heating system is powered by energy collected by the solar energy collection assemblies 101. Roof 110 and/or ceiling of the cavity may be transparent. A small chamber may be located between the roof 110 and the ceiling of the cavity, which may allow for air circulation and cooling of the ceiling to allow the condensation of evaporated water from the floor bed of the cavity. Condensed water may then be collected in a fresh water collection tank 102, 104.

Solar desalination plant 100 may also include one or more fish farms 105, 106. Fish farms 105, 106 may additionally be coupled to one or more algae bioreactors, for example photo-bioreactors (not shown), as further described below. A salt collecting container 103 may contain salt remaining after salt water is evaporated.

A thermally-conductive fluid transport system may include pipes 107 and 108. The thermally-conductive fluid may be, for example, molten salt, a molten salt mixture, thermally-conductive oil, or as desired. According to at least one embodiment, the thermally-conductive fluid may be a molten salt mixture with lithium added to it. In this embodiment, the added lithium may lower the necessary melting temperature of the salt mixture. The thermally-conductive fluid may be heated by energy collection assemblies 101 and transported elsewhere in solar desalination plant 100. For example, heated fluid may provide the heat in the heating system under the floor bed of the interior cavity. Additionally, energy collection assemblies 101, being concave in shape, may allow for the collection of rainwater into containers 109.

Figure 1A:
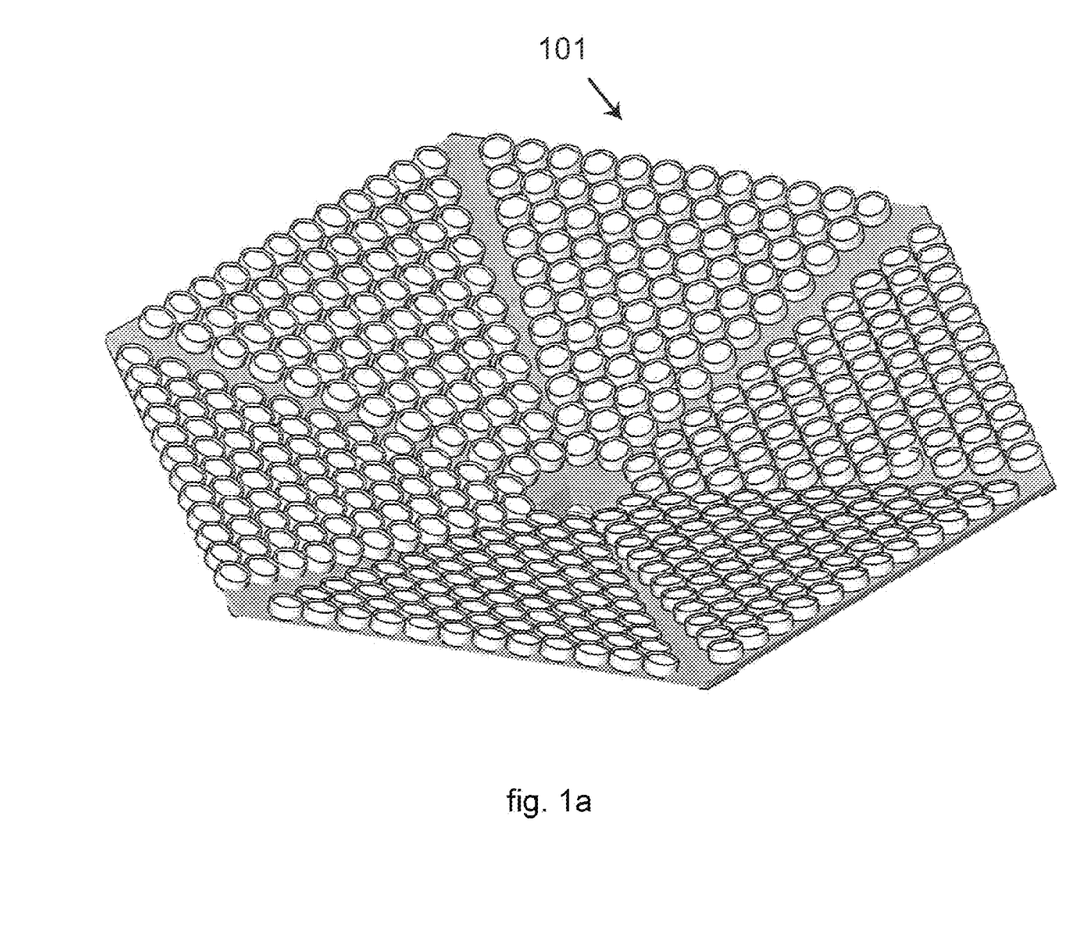
FIG. 1a shows a solar energy collection assembly
Figure 1B:
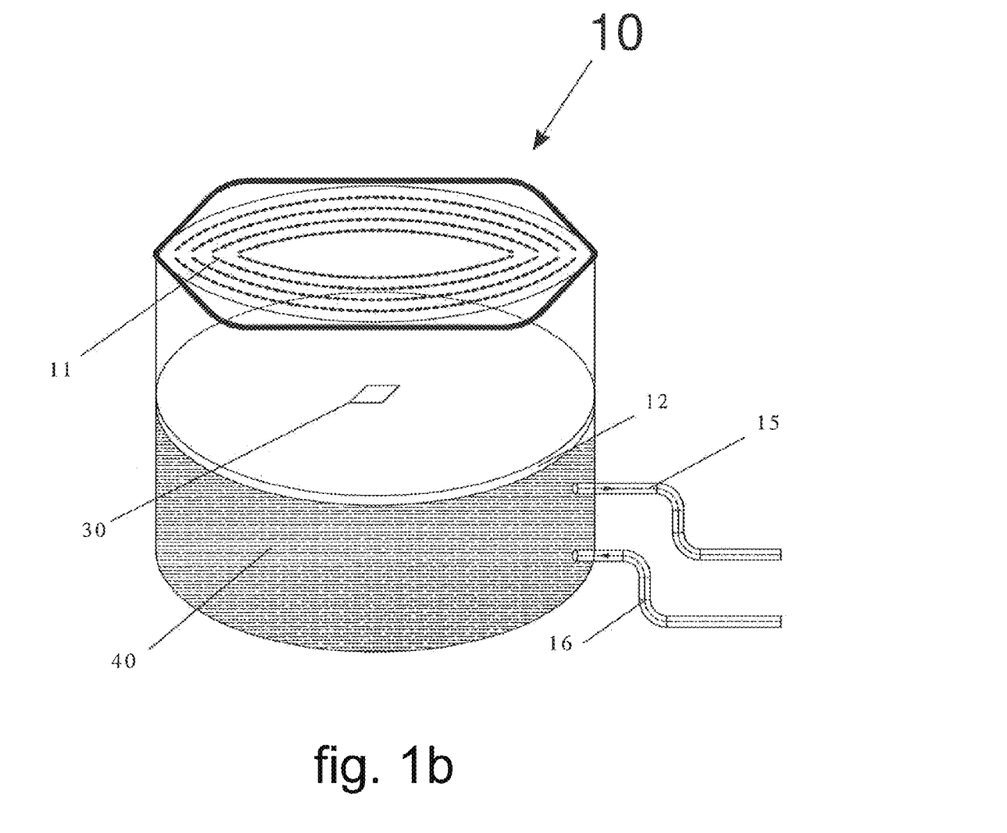
FIG. 1b shows a single solar energy collection unit

Now referring generally to exemplary FIGS. 1a and 1b, an energy collection assembly 101 may include several solar energy collection units 10 in a concave structure. A collection unit 10 may include a concentrating lens 11, a solar photovoltaic (PV) cell 30, and a thermal container 12. Concentrating lens 11 may as thick or as thin as desired for a particular application. Concentrating lens 11 may further be constructed of an acrylic thin-film material, or as desired. Lens 11 may further be constructed of a multiple-micro-lens material. According to one non-limiting example, lens 11 may be constructed of an acrylic thin-film material with a thickness of approximately 0.3175 cm. Additionally, lens 11 may be colored or colorless, as desired, for example to enhance its aesthetic quality, and/or lens 11 may be in any shape, for example a hexagonal shape. PV cell 30 may be located proximate to the focal point of lens 11. Thermal container 12 may be located below lens 11. For example, PV cell 30 may be located on the top exterior surface of thermal container 12. Thermal container 12 may further be painted black. Lens 11, PV cell 30, and thermal container 12 may be constructed in a 1:1 ratio for every collection unit 10 or multiple lenses 11 may be employed for a single thermal container 12, as desired. Lens 11 may be coated with a water- and particulate-resistant material to protect the integrity and functionality of collection unit 10.

In the use of collection unit 10, exemplary temperatures may reach 700-800° Celsius. A thermally-conductive fluid 40 may be used in thermal container 12 to capture and absorb the heat created by concentrating lens 11. Fluid 40 may be conducted to and from container 12 through feeder tube 16 and drainage tube 15. Where multiple thermal containers 12 are used in a single application, thermal containers 12 may be connected in parallel or in series through feeder/drainage tubes 16/15, or as desired. Feeder tube 16 and drainage tube 15 may allow thermally-conductive fluid 40 to flow in a closed-loop system to transfer the heat energy elsewhere to perform work, for example to connect to pipes 107, 108 and heat sea water or produce electricity as elsewhere described. PV cell 30 may produce additional electricity for the solar desalination plant 100, for external uses, or as desired.

Figure 2:
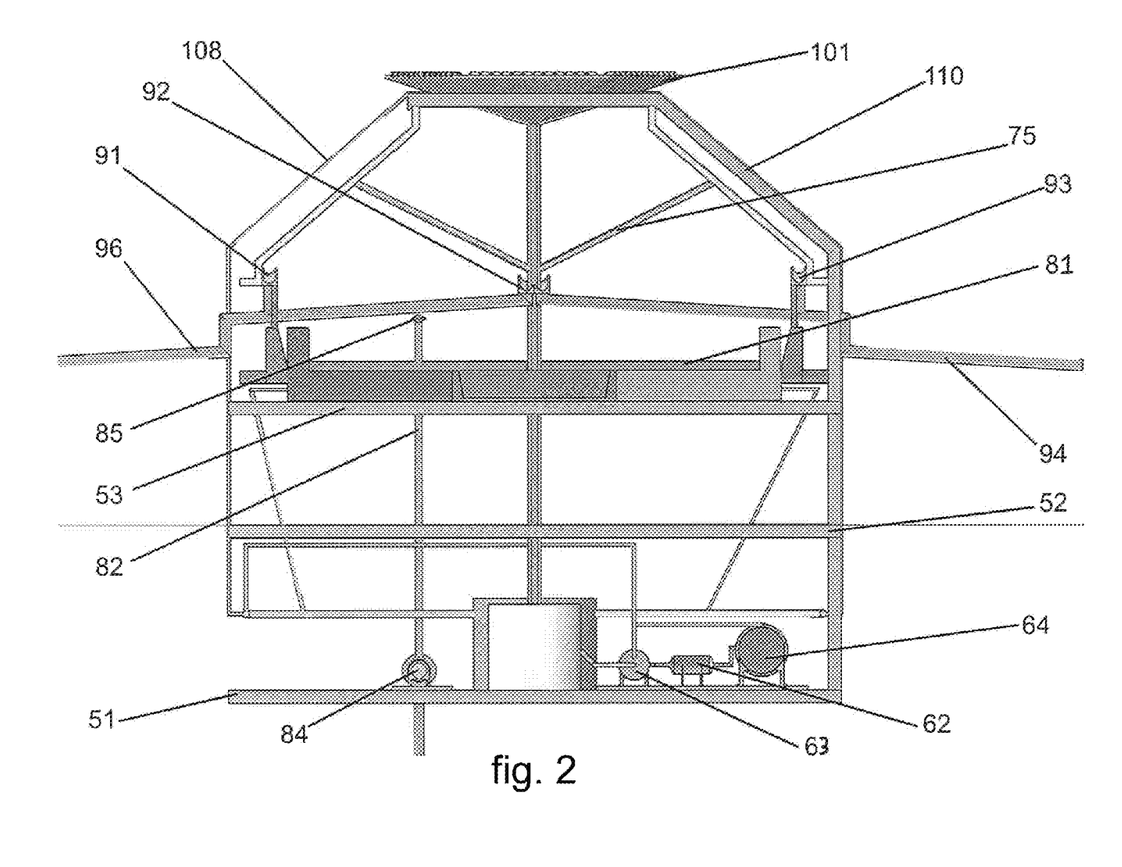
FIG. 2 shows a cross-section of an embodiment

Referring to exemplary FIG. 2, different fluid transportation systems in a solar desalination plant 100 may be utilized. Pump 84, which may be located on the basement floor 51, may pump salt or brackish water through tube 82 to opening 85, which may allow salt or brackish water to flow into or onto floor bed 81. Floor bed 81 may contain the salt or brackish water to be distilled. Floor bed 81 may be slightly elevated above a cavity floor 53 so that a heating system may be placed under floor bed 81. Side collection troughs 91, 93 and center collection troughs 92 may collect distilled water inside the interior cavity. Distilled water may be conducted by gravity through one or more pipes 94, 96 to one or more fresh water collection tanks.

Additionally, tubes 75 may conduct collected fresh rainwater to the interior of the structure for collection in one or more containers 109 as described above and shown in exemplary FIG. 1. Collected fresh water may be used in conjunction with thermally-conductive fluid to create electrical power through turbine 64, condenser 62, and heat exchanger 63, as further explained below.

Figure 3:
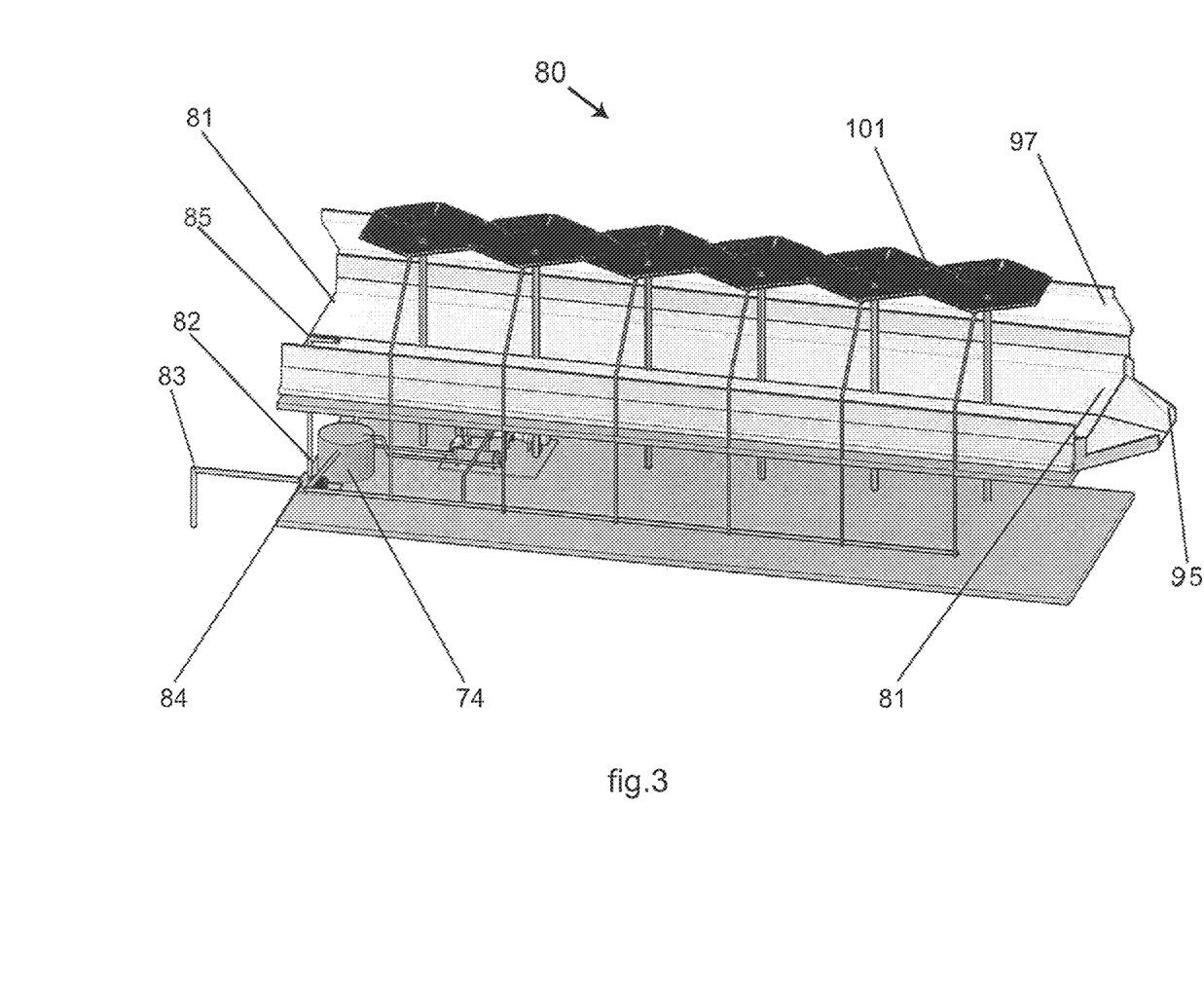
FIG. 3 shows a simplified cut-away of a sea water flowing mechanism

Now referring to exemplary FIG. 3, sea water system 80 may be primarily defined by bed floor 81. Bed floor 81 may be slightly inclined toward opening 95 into a salt collecting container (not shown). Pump 84 may be connected to intake pipe 83. Intake pipe 83 may collect salt or brackish water from any suitable source. For example, intake pipe 83 may be coupled to sand-filtered well to prevent intake of flora, fauna, or unwanted particles, or as desired. Pump 84 may then force salt water up tube 82 to opening 85, which may allow salt or brackish water to flow into or onto floor bed 81.

Figure 4:
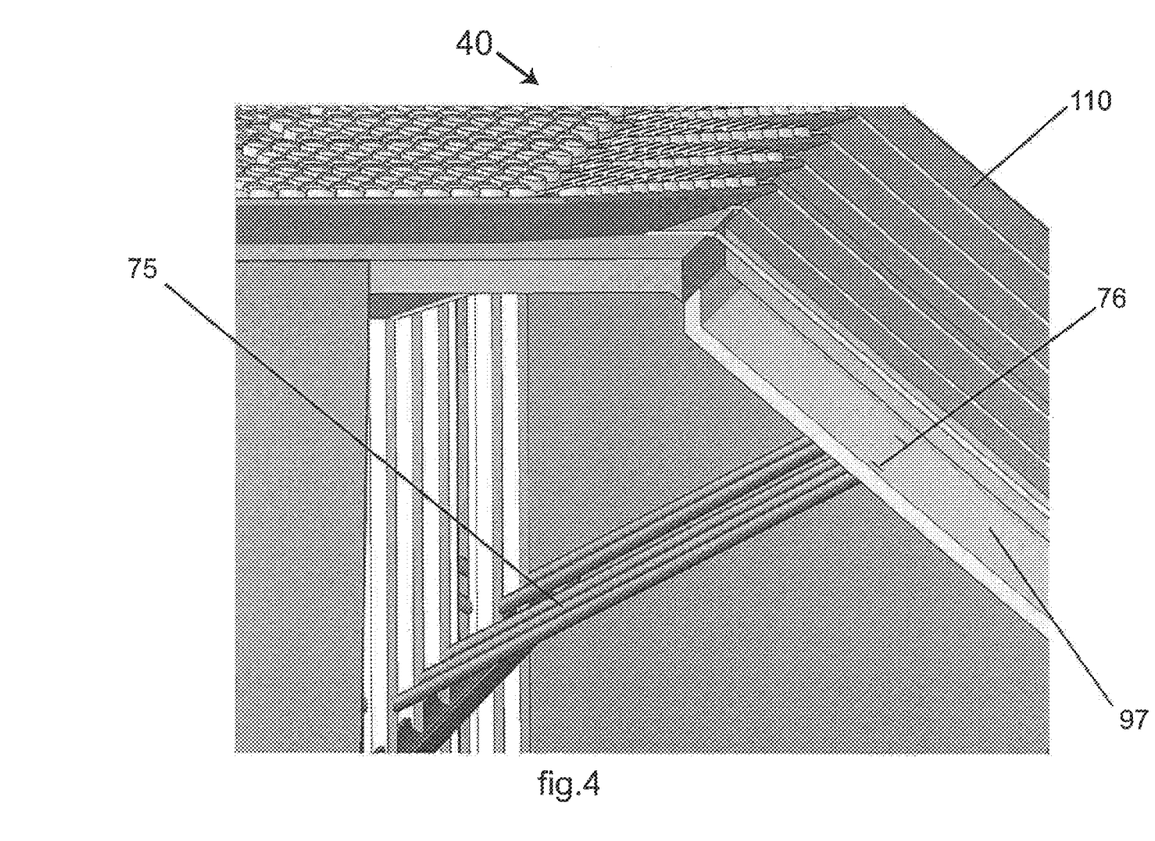
FIG. 4 shows a detail of the roof and ceiling of an embodiment

Exemplary FIG. 4 shows how rainwater collection and cooling chambers 97 may be coupled to tubes 75 through one or more openings 76. Chambers 97 may collect rainwater falling onto the roof 110. Rainwater may then be conducted through openings 76 to tubes 75 and thence to one or more containers 109 (as shown in exemplary FIG. 1). Chambers 97 may also be used as cooling chambers, and may be ventilated by cooled air, for example from containers 109 as shown in exemplary FIG. 9 and further described below. When used as a cooling chamber, chambers 97 may assist in the condensation of water on the ceiling of the interior cavity, thereby assisting the distillation process.

Figure 5:
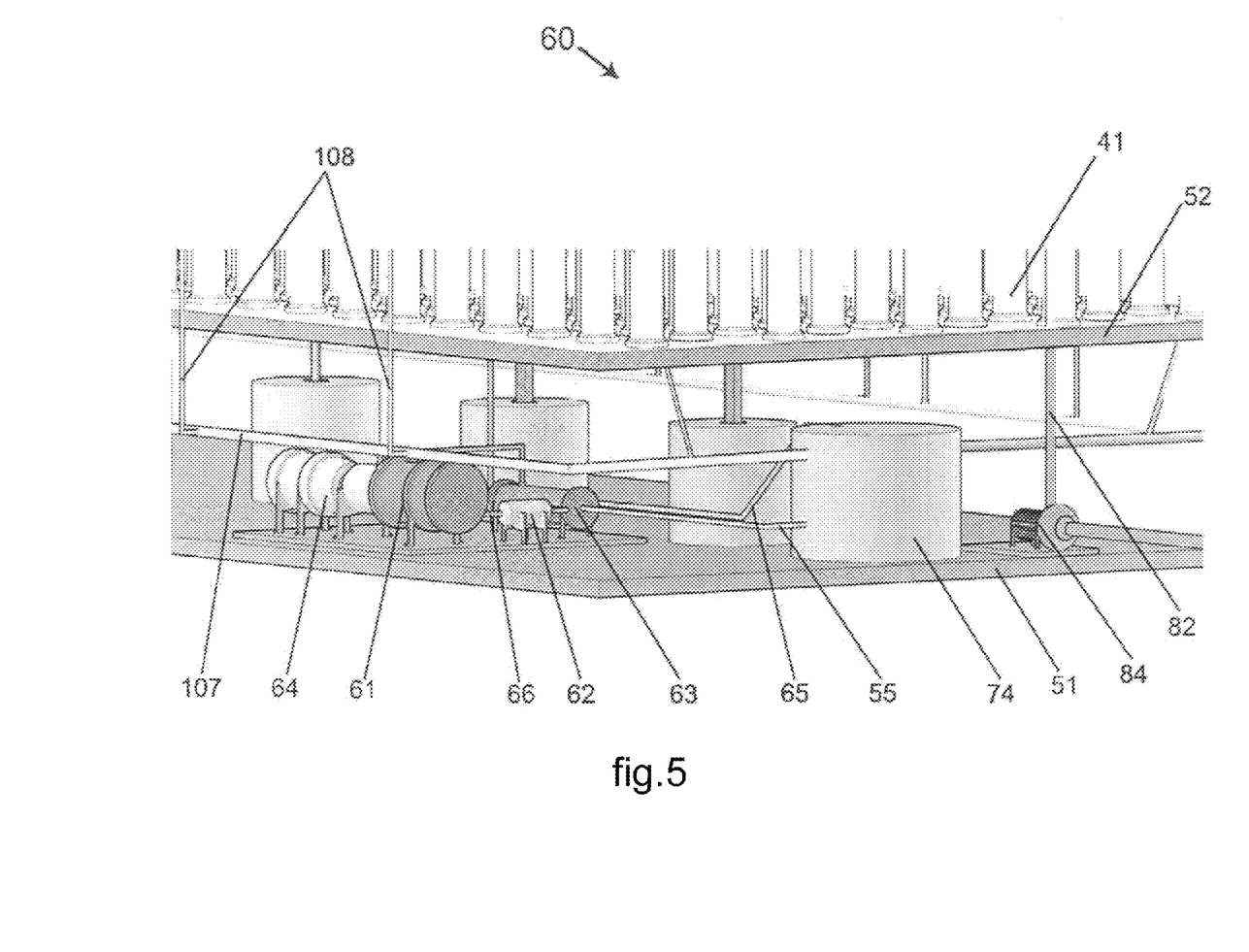
FIG. 5 shows a power generation system

Exemplary FIG. 5 shows a power generation system 60 within a solar desalination plant. Thermally conductive fluid, which may be heated by an energy collection assembly (not shown) may be conducted by pipes 107, 108 into heat exchanger 63. Heat exchanger 63 may accept water, for example water from containers 109, and heat the water to generate water vapor. The water vapor may be conducted to turbine 64, which may rotate an electrical generator 61. Thermally conductive fluid may be stored in container 74, which may help conserve the stored heat in the thermally conductive fluid. Storage may for example take place at night to conserve temperatures until the next day. Stored heat may also be used to generate power at times of little sunlight or as desired. Heat may be stored directly by the thermally conductive fluid or may be stored via heat transfer to another fluid or substance. For example in one embodiment a molten salt may be used as the thermally conductive fluid and the heat storage substance. In another embodiment, thermal oil may be used as the thermally conductive fluid and molten salt may be used as the heat storage substance. Other combinations of the same or different fluids and/or substances may be utilized, as desired. Water vapor leaving turbine 64 may be conducted through tube 66 into condenser 62. Cooled water may then pass back into heat exchanger 63 and restart the process. The electrical energy created by this system may be used to run any of the various electronics controlling the desalination plant and/or be used for external purposes, or as desired.

Figure 6:
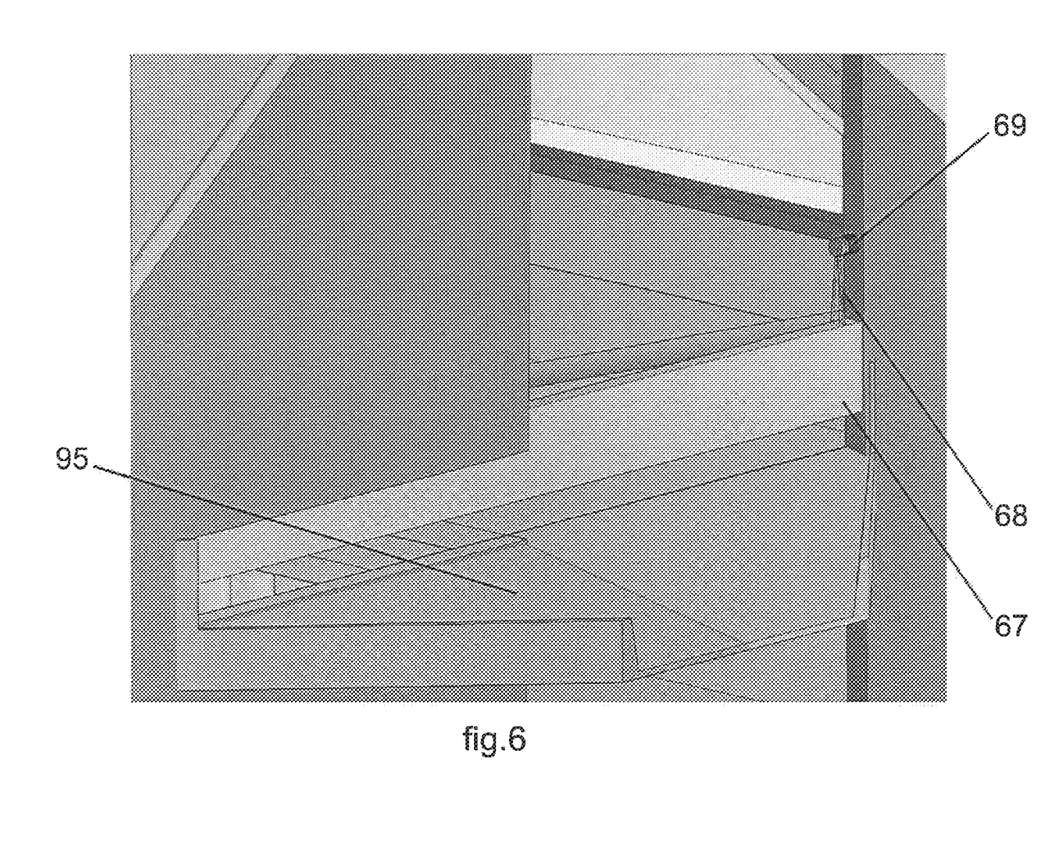
FIG. 6 shows a sliding door for sea water and salt disposal

Now referring to exemplary FIG. 6, on at least one side of a desalination plant a door 67 may be located. Door 67 may be operated by a motor 69 and cord 68, or as desired. Door 67 may open when a certain concentration of salt water inside floor bed 81 in the interior cavity is achieved. When open, highly concentrated salt water or dry salt may move across or through opening 95 and collected in container 103, as shown in exemplary FIG. 1. Collected salt may be utilized for other applications, including food and industrial applications.

Figure 7:
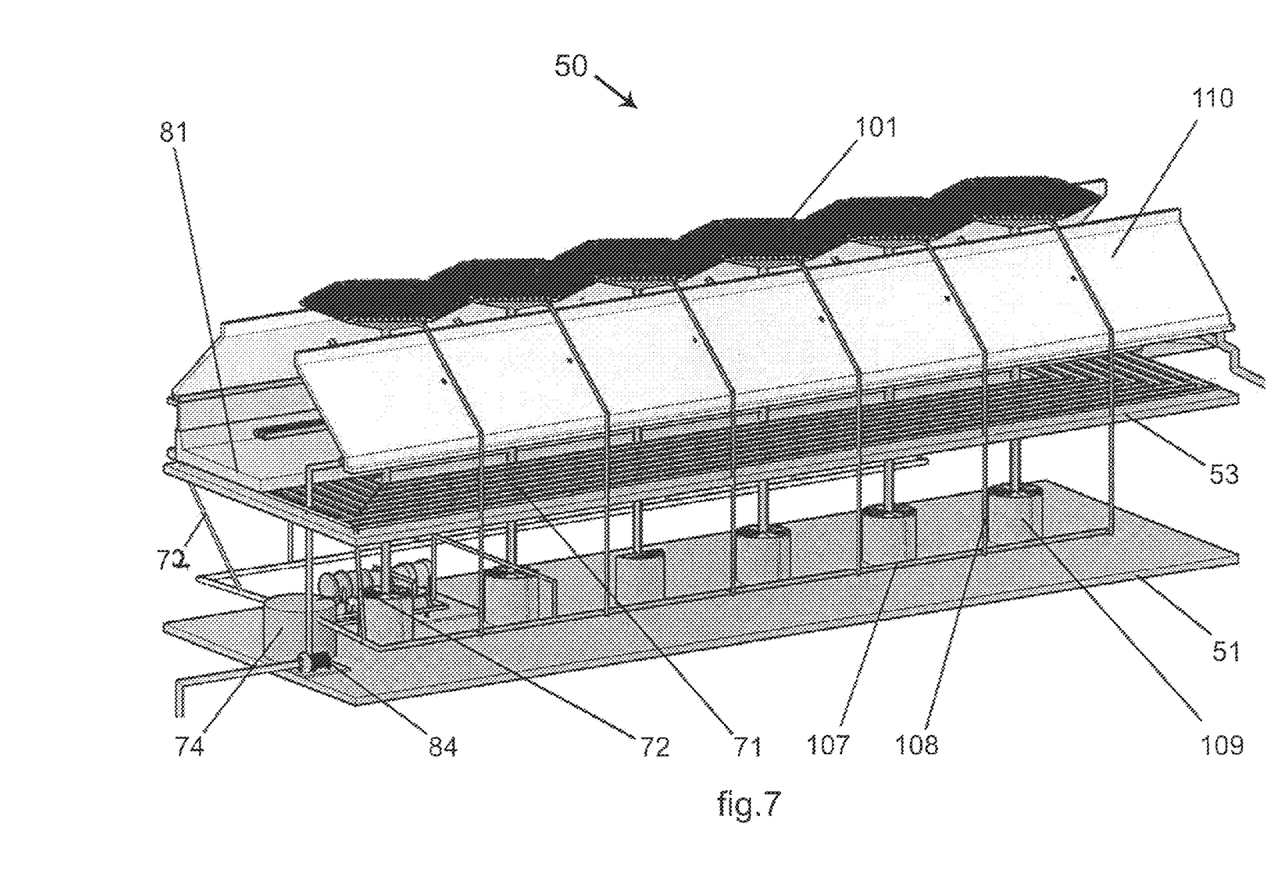
FIG. 7 shows a simplified cut-away of a heating system

Exemplary FIG. 7 shows how a heating system 50 may be used to heat the salt water located on or in floor bed 81. A thermally-conductive fluid may be heated by solar energy collection assemblies 101 and flow through pipes 107, 108. The thermally conductive fluid may be stored in container 74. The thermally-conductive fluid may also flow through pipe 72 to serpentine 71, which may distribute heat across floor bed 81, thereby heating salt water which may be distilled as described above.

Figure 8:
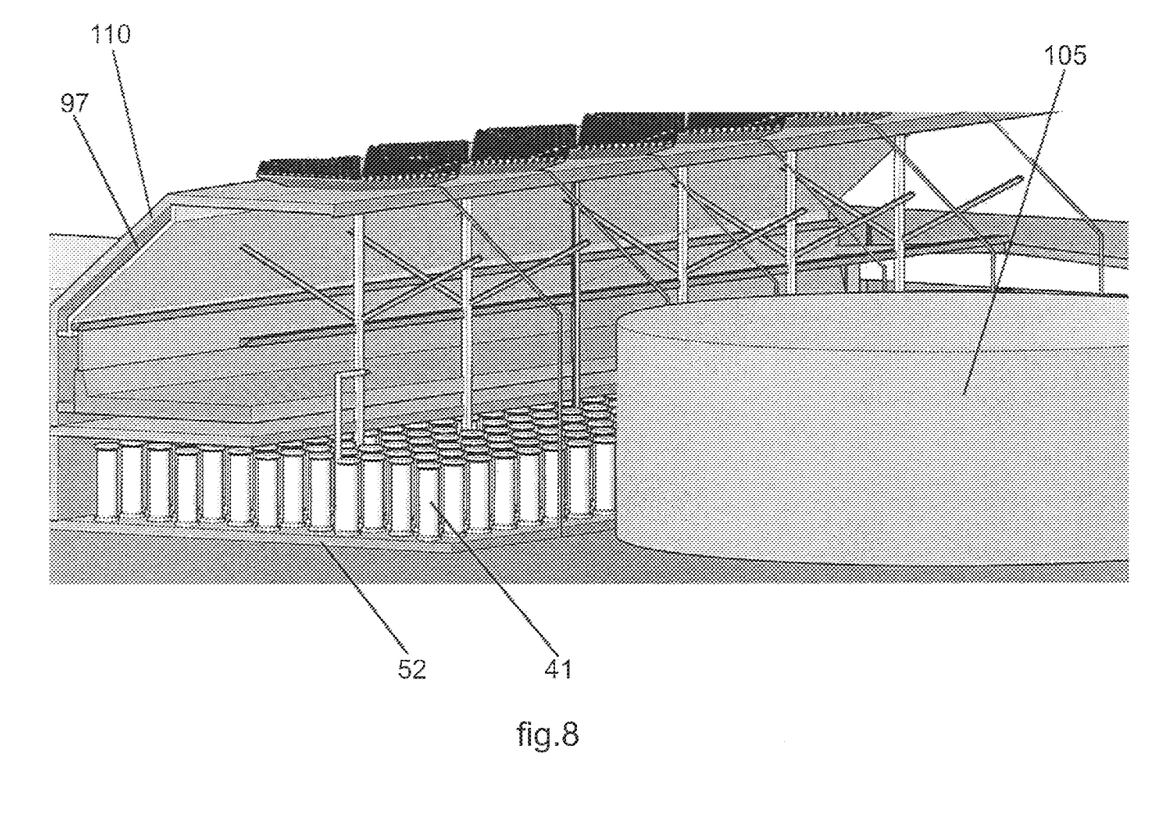
FIG. 8 shows a bioreactor assembly

Referring to exemplary FIG. 8, one or more bioreactors 41 may be located within desalination plant 100. Bioreactors 41 may be, for example, algae photo-bioreactors. Bioreactors 41 may be functionally coupled to one or more fish farms 105 (and 106, as shown in exemplary FIG. 1). Fish in the fish farms 105 may be producing excrements used as nutrition for the microorganisms in the bioreactors 41 and the microorganisms may produce oxygen and nutrition for the fish. The bioreactors 41 may also serve as a filtering system for incoming salt or brackish water, whereby the water is passed through the bioreactors to remove various impurities before being pumped onto floor bed 81.

Figure 9:
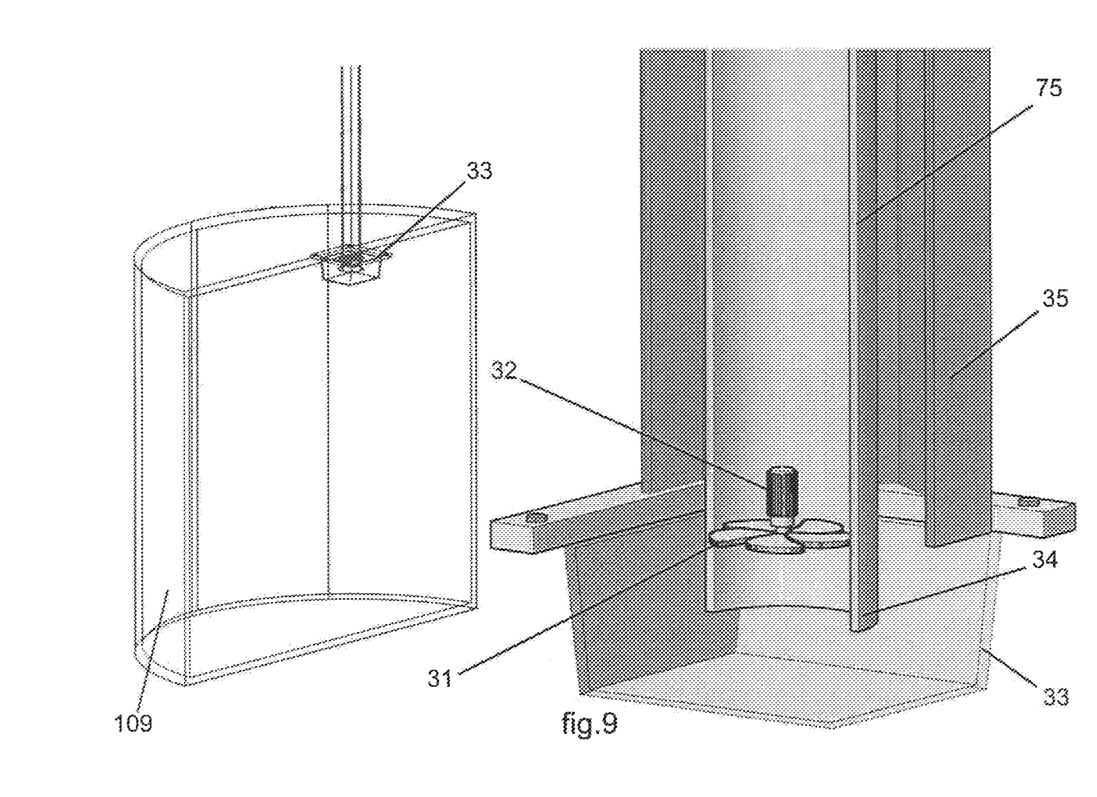
FIG. 9 shows a cross-section of a collection tank and ventilator

Now referring to exemplary FIG. 9, rainwater container 109 may include a ventilation system. A ventilator 31 with a motor 32 may be placed inside tube 75 proximate to the top of rainwater container 109. A filter 33 may be placed at the opening into container 109 to catch any debris which might otherwise contaminate the stored water. An outer tube 35 may be provided which may allow for the dripping of water down into container 109 without interfering with ventilation air being blown up through a central shaft 34 of tube 75. The cool air from container 109 may be blown up tube 75 to cooling chambers 97 to cool evaporated water vapor and condense it inside the interior cavity.

Now referring generally to all of the above-mentioned exemplary FIGS. 1-9, in construction, the side walls of solar desalination plant 100 may be transparent to allow solar rays to penetrate the structure and help heat the salt water inside the cavity. The slanted portion of roof 110, or the section of the roof covering cooling chambers 97, may have a reflective coating or paint color used to prevent cooling chambers 97 from unduly heating. Floor bed 81 may be constructed of a transparent material, for example to allow sunlight to pass through to nourish bioreactors 41.

In use, the solar desalination plant may combine several systems to work efficiently. A solar energy capturing system may heat a thermally-conductive fluid which may be used in conjunction with a heat exchanger to drive a water vapor turbine, which in turn may drive a generator. The electricity from the generator may power the desalination plant. The plant may have a salt water intake, and utilize a distillation cavity heated by the thermally conductive fluid to distill fresh water, which can then be stored or transported away, or as desired. Cooling for the distillation process may be accomplished through the use of cooling chambers cooled by ventilators located in cool rainwater cisterns. Prior to being distilled, the salt water may first undergo a natural filtration process in controlled bioreactors containing microorganisms, which themselves may be kept in balance with a fish farm.

According to at least one embodiment, an integrated solar desalination plant may function using some or all of the above-described systems to work at a high efficiency of fresh water production, power generation, and sustainability. Such an embodiment may be capable of producing fresh water at a comparable throughput to conventional reverse osmosis desalination plants.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A system for producing electricity and fresh water, comprising:
   a desalination facility having a roof and a distillation chamber defined in part by a floor bed;
   a thermally-conductive fluid disposed within the distillation chamber for heating at least a portion thereof;
   at least one cooling chamber disposed within the distillation chamber and configured to collect rainwater from the roof of the desalination facility;
   at least one solar energy collection assembly arranged on the roof of the facility to receive solar radiation and heat the thermally-conductive fluid;

a fluid flow path coupled to the at least one solar energy collection assembly for transporting the thermally-conductive fluid;

a power generation assembly in fluid communication with the at least one cooling chamber to receive rainwater therefrom; and a salt water intake operatively coupled to the distillation chamber for pumping salt water into the floor bed;

wherein the at least one solar energy collection assembly is configured to heat the thermally-conductive fluid, and the thermally-conductive fluid is subsequently conveyed through the fluid flow path to at least one of the heating system and the power generation assembly wherein the heating system is configured to heat salt water within the distillation chamber thereby producing water vapor, and the at least one cooling chamber is configured to facilitate condensation of the water vapor within the distillation chamber thereby producing desalinated water.

2. The system for producing electricity and fresh water of claim 1, wherein the thermally-conductive fluid comprises a molten salt.

3. The system for producing electricity and fresh water of claim 2, wherein the thermally-conductive fluid further comprises lithium.

4. The system for producing electricity and fresh water of claim 1, further comprising at least one collection trough disposed within the distillation chamber for collecting desalinated water.

5. The system for producing electricity and fresh water of claim 4, further comprising at least one fresh water collection tank in fluid communication with the at least one collection trough to receive desalinated water therefrom.

6. The system for producing electricity and fresh water of claim 1, further comprising at least one rainwater collection container in fluid communication with the at least one cooling chamber to receive rainwater therefrom.

7. The system for producing electricity and fresh water of claim 6, wherein the power generation assembly is in fluid communication with the at least one rainwater collection container.

8. The system for producing electricity and fresh water of claim 6, further comprising a ventilation system incorporated into the rainwater collection container to facilitate cooling of the distillation chamber, the ventilation system comprising:

at least one conduit having an inlet and an outlet, the at least one conduit extending between the cooling chamber and the rainwater collection container;

a ventilator with an attached motor disposed within the at least one conduit proximate an opening of the rainwater collection container; and a filter disposed between the inlet and the opening of the rainwater collection container and configured to allow preferential passage of water relative to debris in a rainwater supply passed therethrough.

9. The system for producing electricity and fresh water of claim 1, further comprising at least one bioreactor fluidly connected to the salt water intake and configured to filter incoming salt water prior to pumping the salt water into the floor bed.

10. The system for producing electricity and fresh water of claim 9, wherein the at least one bioreactor is an algae photo-bioreactor.

11. The system for producing electricity and fresh water of claim 9, further comprising at least one fish farm communicatively coupled to the at least one bioreactor.

12. The system for producing electricity and fresh water of claim 1, further comprising a sand-filtered well coupled downstream from the salt water intake.

13. The system for producing electricity and fresh water of claim 1, wherein the desalination facility further comprises at least one side wall defining the periphery of the distillation chamber, an aperture formed in the least one side wall to provide access to an interior of the distillation chamber, and a door pivotally attached to the at least one side wall for selectively opening and closing the aperture.

14. The system for producing electricity and fresh water of claim 13, wherein the floor bed is inclined downwardly toward the door, and the door is configured to open when a salinity within the floor bed is at a concentration greater than a predetermined threshold.

15. The system for producing electricity and fresh water of claim 13, further comprising a salt collection container configured to collect a waste product through the door.

16. The system for producing electricity and fresh water of claim 1, wherein the desalination facility further comprises a chamber floor, the floor bed is elevated above the chamber floor, and the heating system is positioned therebetween.

17. The system for producing electricity and fresh water of claim 7, wherein the at least one solar energy collection assembly is configured to collect rainwater from the roof and convey the rainwater to the at least one rainwater collection container.

* * * * *